United States Patent [19]

Hack

[11] Patent Number: 4,998,146
[45] Date of Patent: Mar. 5, 1991

[54] HIGH VOLTAGE THIN FILM TRANSISTOR

[75] Inventor: Michael Hack, Mountain View, Calif.

[73] Assignee: Xerox Corporation, Stamford, Conn.

[21] Appl. No.: 356,900

[22] Filed: May 24, 1989

[51] Int. Cl.$^5$ .............................................. H01L 49/02
[52] U.S. Cl. ................................................ 357/4; 357/2; 357/23.7; 357/59
[58] Field of Search ..................... 357/2, 23.7, 4, 59 B

[56] References Cited

U.S. PATENT DOCUMENTS

| | | | |
|---|---|---|---|
| 4,425,572 | 1/1984 | Takafuji et al. | 357/4 |
| 4,597,001 | 6/1986 | Bortscheller et al. | 357/23.7 |
| 4,704,623 | 11/1987 | Piper et al. | 357/2 |
| 4,740,829 | 4/1988 | Nakagiri | 357/2 |
| 4,752,814 | 6/1988 | Tuan | 357/23.7 |
| 4,766,477 | 8/1988 | Nakagawa et al. | 357/4 |
| 4,814,842 | 3/1989 | Nakagawa et al. | 357/23.7 |

FOREIGN PATENT DOCUMENTS 0138281 10/1978 Japan ................................. 357/23.7

Primary Examiner—Andrew J. James
Assistant Examiner—Courtney A. Bowers
Attorney, Agent, or Firm—Serge Abend

[57] ABSTRACT

A high voltage thin film transistor comprising a charge transport layer, source and drain electrodes laterally spaced from one another and each being in low electrical resistance contact with the charge transport layer, a gate electrode spaced normally from the source and drain electrodes and extending laterally with one edge in the vicinity of the source electrode and an opposite edge located between the source and drain electrodes, and a gate dielectric layer separating the gate electrode from the source and drain electrodes and the charge transport layer, in the normal direction wherein the gate electrode and the source and drain electrodes are located on the same side of the charge transport layer.

4 Claims, 3 Drawing Sheets

HIGH VOLTAGE THIN FILM TRANSISTOR

FIELD OF THE INVENTION

This invention relates to a modified, non-single crystalline semiconductor, high voltage thin film transistor having good OFF-state current leakage protection.

BACKGROUND OF THE INVENTION

Electronic technology today relies almost exclusively on crystalline silicon with compound semiconductors, such as GaAs, occupying small, but important, niches in optoelectronic and high speed applications. Amorphous silicon device configurations have rapidly progressed in both their performance and stability since the first report in 1979 by LeComber et al (Electronic Letters 15, 179 [1979]) of an amorphous silicon field effect transistor. Amorphous silicon technology has emerged as a prime candidate for large area thin film applications, first in photovoltaic applications and later in large area integrated circuits used in flat liquid crystal displays, solid state imagers, electronic copiers, printers and scanners. This semiconductor material is ideally suited for large area arrays(in excess of 12 inches by 12 inches) because the low deposition temperatures involved in its glow discharge fabrication process, make possible the use of inexpensive substrate materials, such as glass.

By comparison to crystalline silicon devices, the main difference with amorphous silicon devices is the relatively low electron band mobility ($\leq 20$ cm$^2$/Vs) of the latter coupled with a relatively large density of localized states. This results in amorphous silicon devices having a slower switching time than single crystalline devices. However, in many large area applications, such as printing, since numerous operations can be performed in parallel, the overall system speed is quite fast. Futhermore, since amorphous silicon has a wide effective energy gap, an extremely large photoconductivity and good light senitivity, it is uniquely suited for optelectronic applications, particularly in the visible range.

In U.S. Pat. NO. 4,752,814 (Tuan) entitled "High Voltage Thin Film Transistor", assigned to the same assignee as the present application, there is taught a unique a-Si:H transitor device which may be operated at 500 volts, or more. In operation, several hundreds of volts can be switched by a low voltage gate signal. As with other amorphous silicon transistors, its fabrication process is simple and is compatible with other film devices. Several layers are sequentially deposited and patterned upon a substrate. An undoped or lightly doped, amorphous silicon charge transport layer is sandwiched between a conductive gate metal electrode and a gate dielectric layer, on one side, and n+ doped source and drain electrodes, on its other side. As described in this earlier patent, the device relies upon the face-to-face orientation of the gate electrode and the source electrode, in order that the gate electrode can control the injection of electrons flowing from the source into the charge transport layer. The electric field created by the insulated gate electrode attracts or repels electrons.

In U.S. Pat. No. 4,425,572 (Takafuji et al) entitled "Thin Film Transistor" there is disclosed a low voltage thin film transistor device having a gate electrode which does not extend fully between source and drain, in order to reduce voltage stress across the gate dielectric and to make the device more robust and less susceptible to dielectric breakdown. It should be noted that the charge transport layer is made of tellurium which supports ohmic current flow. Several prior art low voltage transistor configurations are illustrated in FIGS. 1-4, wherein the gate electrode is shown to fully span the channel between source and drain.

It is well known that in a high voltage, amorphous silicon, thin film transistor, of the type disclosed in the '814 patent, the gate electrode should not extend fully to the drain electrode, in order to maintain dielectric integrity. However, by offsetting the gate electrode, the degree of control over the OFF-state leakage current is diminished. The gate is less able to screen the source from the drain field. Furthermore, in such an amorphous silicon transistor wherein the charge transport layer between the source and drain includes a portion controlled by the gate (channel region) and a portion not controlled by the gate (dead region), current flow through the dead region will be space charge limited (SCLC). However, since the space charge limited leakage current varies superlinearly with the voltage imposed upon the drain electrode, one can expect leakage current at high drain voltages to be orders of magnitude higher than leakage current at low drain voltages. For example, if the drain electrode voltage is increased from 10 volts to 1000 volts, the space charge limited current would increase not by a factor of 100 (as with ohmic current), but closer to a factor of 10,000. Clearly this superlinearity exacerbates the source/drain leakage problem in high voltage devices of this type. For this reason, it was taught in the '814 patent that the requisite control of leakage current could only be achieved by the face-to-face orientation of the source electrode and gate electrode across the charge transport layer.

It is an object of this invention to provide a modified high voltage thin film transistor having a high ON/OFF ratio and effective leakage current suppression without sandwiching the source and gate electrodes in face-to-face relationship about the charge transport layer.

SUMMARY OF THE INVENTION

These and other objects may be carried out, in one form, by providing a high voltage thin film transistor comprising a plurality of superposed laterally extending layers deposited upon a substrate in a normal direction. These layers include a charge transport layer, source and drain electrodes laterally spaced from one another and each being in low electrical resistance contact with the charge transport layer, a gate electrode spaced normally from the source and drain electrodes and extending laterally with one edge in the vicinity of the source electrode and an opposite edge located between the source and drain electrodes, and a gate dielectric layer separating the gate electrode from the source and drain electrodes and the charge transport layer, in the normal direction. The gate electrode and the source and drain electrodes are located on the same side of the charge transport layer.

BRIEF DESCRIPTION OF THE DRAWINGS

A more complete understanding of the present invention and its attendant advantages may be obtained by reference to the following drawings taken in conjuction with the accompanying description in which.

DETAILED DESCRIPTION OF THE PREFERRED EMBODIMENTS

Figure 1:
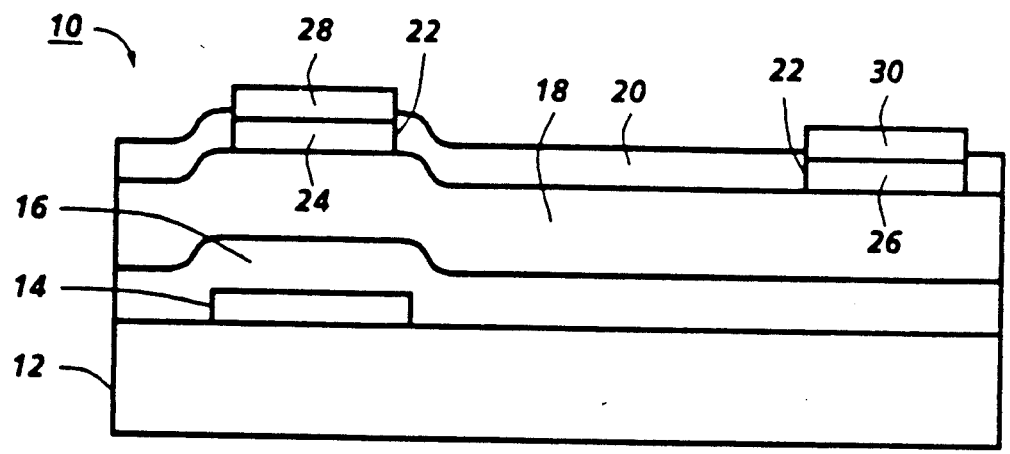
FIG. 1 is a schematic cross-sectional view of a prior art high voltage thin film transistor.

Turning now to FIG. 1 there is disclosed the high voltage thin film transistor 10 which is the subject of U.S. Pat. No. 4,752,814. It includes a substrate 12 upon which are sequentially deposited a number of patterned layers for forming a gate electrode 14, a gate dielectric 16, a non-single crystalline semiconductor charge transport layer 18, and a passivation dielectric layer 20 having openings 22 therein for receiving source electrode 24 and drain electrode 26, each of which is contacted by a respective source contact 28 and drain contact 30. As understood at the time, and described in the patent, it is necessary that the charge transport layer 18 be sandwiched between the gate electrode and the source electrode, which face one another in overlapping relationship, so that the gate electrode controls injection of charge carriers from the source electrode by attraction or repulsion in accordance with an appropriate bias imposed on the gate electrode. This sandwiching orientation effectively suppresses leakage current, when the device is OFF, through the charge transport layer by suppression of flow of carriers from the source.

Figure 2:
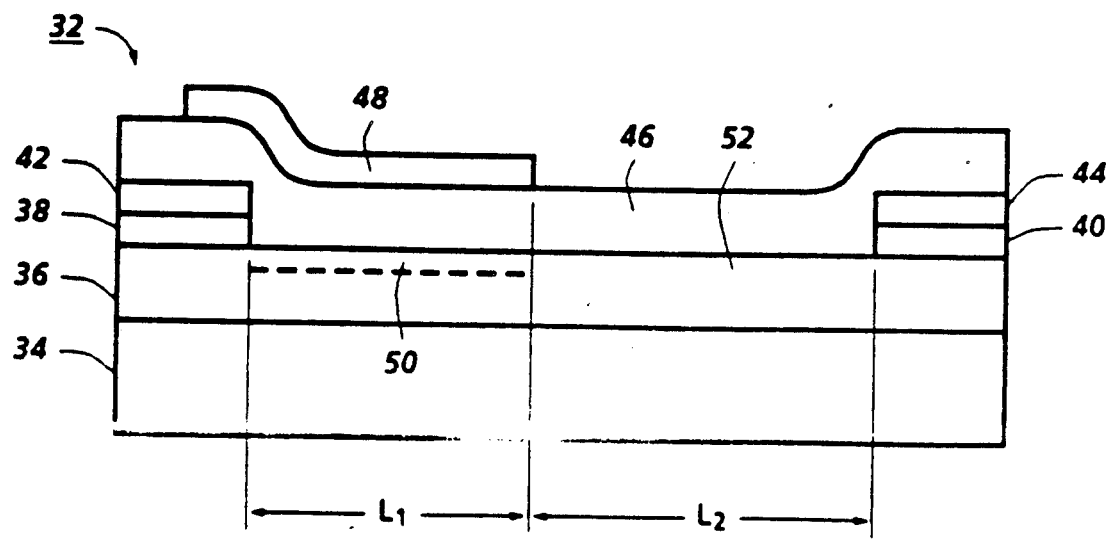
FIG. 2 is a schematic cross-sectional view of one form of a modified top gate high voltage thin film transistor.
Figure 3:
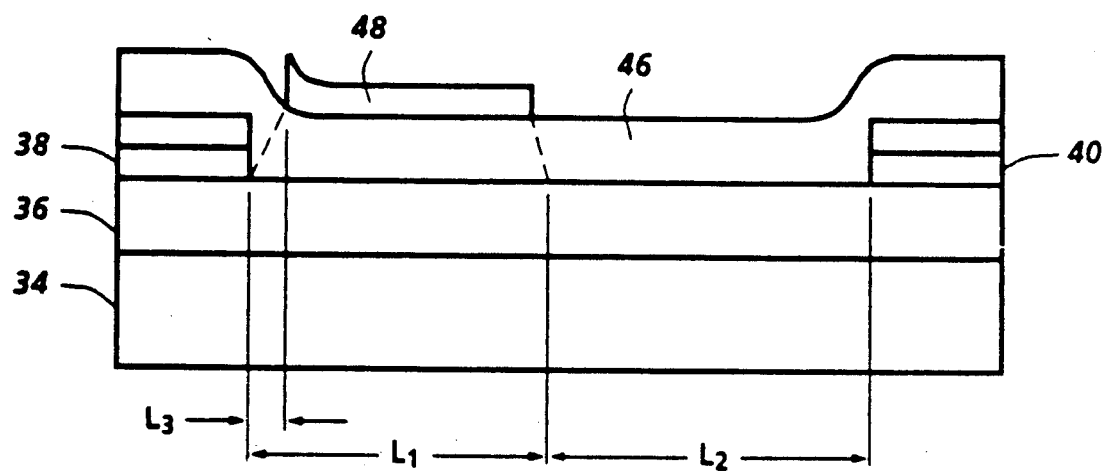
FIG. 3 is a schematic cross-sectional view of another form of the modified top gate high voltage thin film transistor of FIG. 2.

I have determined that the sandwiching orientation required by the '814 patent is not the only possible high voltage thin film transistor structure, and that the device modifications illustrated in FIGS. 2 and 3 operate satisfactorily. In accordance with my analysis of charge flow in thin film high voltage transistors, I have concluded that is sufficient to position a gate electrode close to the source and extending beyond the source toward the drain, and to position the source electrode near to the channel region of the charge transport layer, at a location where there is a low resistance path to the source/channel interface in order to make a high voltage thin film transistor with useful characteristics. In theory of operation will become apparent as the device is described below in structural and functional terms.

In FIG. 2 there is illustrated a top gate form of my modified HVTFT32. It includes a substrate 34 which may be of glass, ceramic, or other suitable material, upon which is deposited a charge transport layer 36, made of a non-single crystalline material having substantially intrinsic semiconductor properties, preferably amorphous silicon. Source electrode 38 and drain electrode 40 are laterally spaced in intimate contact with layer 36, and are made of the same material as the charge transport layer which is suitably doped to provide charge carriers of the desired type, i.e. electrons (n+) or holes (p+). Source contact 42 and drain contact 44 overlie source and drain electrodes and are made of a suitable conductive material, such as Al. The source and drain electrodes and contacts are preferably simultaneously patterned from their respectively deposited layers. A gate dielectric layer 46, usually SiN or $Si_2O_3$, overlies the source and drain, and a gate electrode 48, made of any suitable conductive layer, such as Cr, NiCr, is patterned thereon, so as to be located in a desired lateral position. The extent of the gate electrode (unscreened by the source electrode) acts upon the charge transport layer over a distance $L_1$ to define a channel region 50 located primarily adjacent to the charge transport layer/gate dielectric interface (identified by the dotted line), while the uncontrolled remainder of the charge transport layer over distance $L_2$ defines a dead region 52. The source contact is usually connected to ground, or to a suitable reference potential, the drain contact is usually connected, through a load resistor, to a high voltage supply (on the order of serveral hundred volts) of suitable polarity, with respect to the polarity of the charge carriers (positive for electron carriers or negative for hole carriers), and the gate electrode is connected to a switchable low voltage supply (on the order of zero to fifteen volts).

In operation of this transistor, two generally orthogonal electric fields are generated (I have termed these "normal" and "lateral" as defined by their relationship to the generally planar layers of the device). In the device ON condition, the normal electric field, induced by the voltage on the gate electrode, induces charge carriers into that portion of the charge transport layer 36 in face-to-face relationship with the gate electrode, so as to form the conductive channel 50 at the interface of the layer 36 and the gate dielectric layer 46. Charge is supported in the channel when a gate potential is applied, by forming a capacitor defined by the conductive gate, the gate dielectric and the charge transport layer. An equal and opposite charge to that applied to the gate is induced at the aforesaid interface (channel region 50). Most of that charge will be trapped in localized states although some will be free carriers, causing the Fermi level to move up toward the conduction band and making the channel very conducting. Although the charge will be thermally generated within the charge transport layer (at a very slow rate), a practical device requires that the channel charge be supplied by the source electrode 38 in contact with the transport layer. In order to provide an abundant supply of charge carriers to flow into the channel 50, the source electrode must be in physical contact with the channel via a low resistance path and preferably in ohmic contact to the outside world.

While, in most circumstances, it is desirable for the gate and source electrodes to overlap (as shown in FIG. 2) in order to provide this low resistance path, I have shown in FIG. 3 that such an overlap is not necessary if the lateral offset $L_3$ between the gate and the source is about one dielectric thickness. This situation relies upon the phenomenon of field spreading from the edge of the gate (as indicated by the dotted lines) which causes the channel to extend outward beyond the vertical dimensions of the gate electrode. It follows that as long as the induced channel extends into contact with the source electrode so that the source may supply an abundance of charge carriers to the channel the device designer is freed from prior art constraints.

Figure 5:
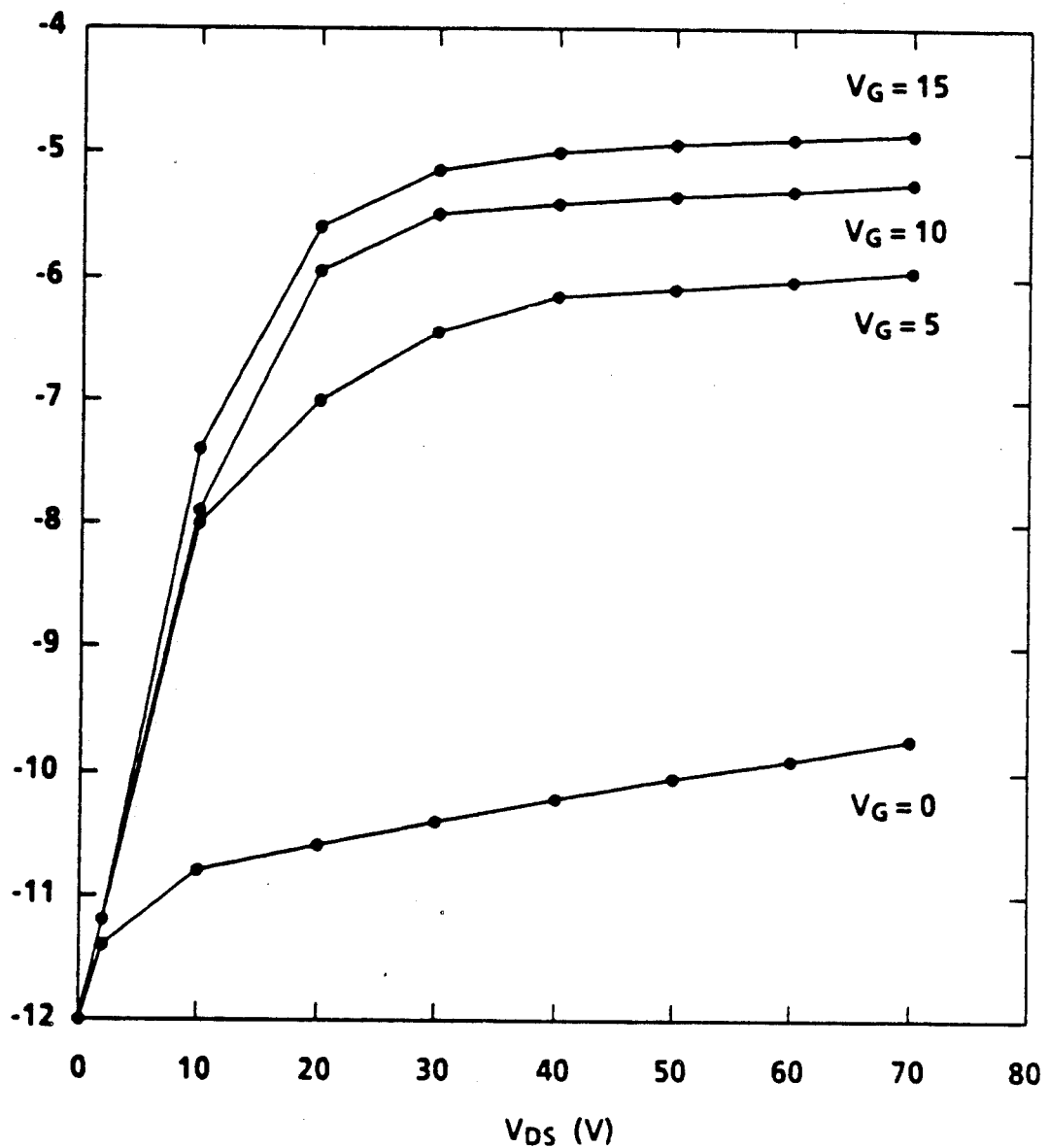
FIG. 5 is a graphical representation of the output characteristics of the modified high voltage thin film transistor of this invention.

The second electric field of this device, a lateral electric field, induced by the voltage on the drain electrode, acts as a transport field between source and drain giving rise to current flow through the charge transport layer, for sweeping charges out of the channel region 50 and through the dead region 52. The dead region of the charge transport layer (at the end of the channel region), where the gate field suddenly drops off, has a low conductance. Current in this dead region will be limited by the ability of the drain voltage to make it conductive by charge injection into this region from the channel region. Since it is necessary to maintain a relatively high space charge density therein to make it conductive, the current will be space charge limited. Thus, the drain field supports charge injection into the dead region from the channel and sweeps charge through this region, while the gate field controls the number of charges which may be injected from the channel region into the dead region. As can be seen in FIG. 5, drain current $I_{DS}$ is plotted against drain voltage $V_{DS}$ for various gate voltages $V_G$. The superlinear relationship of drain current to drain voltage, as a result of the space charge limited condition, can be seen in the region to the left of the knee of each curve, beyond which saturation prevails.

When the gate is OFF (i.e. $V_{gs}$ is low and $V_{ds}$ is high), an extremely high source/drain leakage current would flow, and this must be prevented for the device to be practical. As noted above, the superlinearity of space charge limited current exacerbates the source/drain leakage problem. In its OFF condition the gate electrode is maintained at a reference potential, preferably ground, which is substantially the same as the source potential. Since the gate electrode is much nearer to the source electrode than it is to the drain electrode and has a portion thereof extending closer to the drain electrode than any portion of the source electrode, it will, in the OFF condition, act as an alectrostatic shield, preventing the drain field from reaching the source electrode and drawing charge carriers therefrom. In this new device structure it is this electrostatic shielding that enables low OFF currents to be achieved. In the ON condition (i.e. $V_{gs}$ is high), the gate supports a conducting channel in the charge transport layer extending from the source electrode to the edge of the gate electrode, such that this channel injects charge into the ungated dead region.

Figure 4:
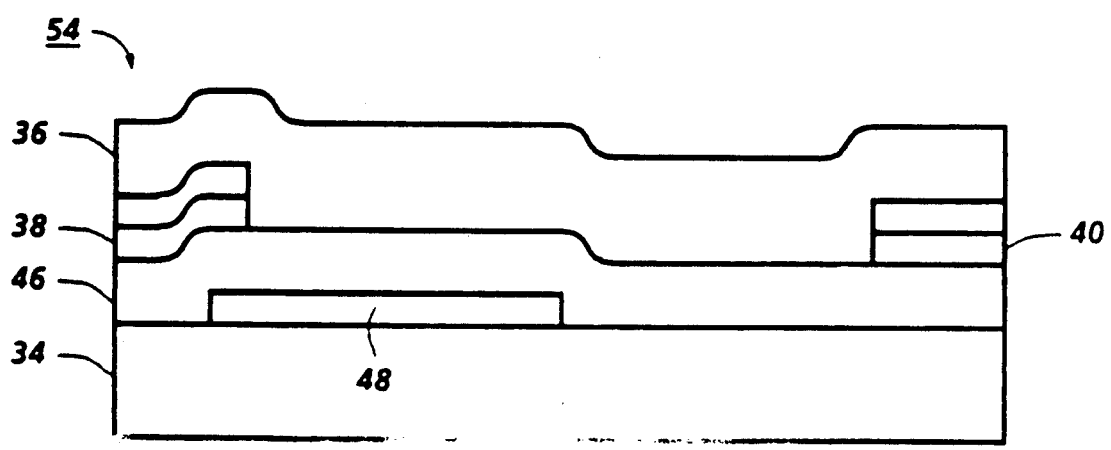
FIG. 4 is a schematic cross-sectional view of a modified bottom gate high voltage thin film transistor.

The embodiment of FIG. 4 is an inverted device 54, i.e. bottom gate, and is suggested as an alternative construction. For clarity, the same numerals have been applied as in FIG. 2.

It should be understood that the present disclosure has been made only by way of example, and that numerous changes in detail of construction and the combination and arrangement of parts may be resorted to without departing from the true spirit and scope of the invention as hereinafter claimed.

What is claimed:

1. A high voltage thin film transistor comprising a plurality of superposed layers deposited upon a substrate in a normal direction, said layers extending laterally, characterized by comprising
   a charge transport layer,
   source and drain electrodes being laterally spaced from one another and each being in low electrical resistance contact with said charge transport layer,
   a gate electrode spaced normally from said source and drain electrodes and extending laterally with one edge close to the edge of said source electrode which faces said drain electrode, and an opposite edge located between the facing edges of said source and drain electrodes,
   a gate dielectric layer separating said gate electrode from said sorce and drain electrodes and said charge transport layer, in said normal direction, such that said gate electrode and said source and drain electrodes are located on the same side of said charge transport layer, and
   wherein the portion of said charge transport layer which faces said gate electrode defines a channel region therein, and the portion of said charge transport layer which extends between the end of said channel region and the closet edge of said drain electrodes defines a dead region therein through which space charge limited current flows in the ON state of said transistor.

2. The high voltage thin film transistor as defined in claim 1 wherein said one edge of said gate electrode overlaps said edge of said source electrode which faces said drain electrode.

3. The high voltage thin film transistor as defined in claim 1 wherein said one edge of said gate electrode is spaced from said edge of said source electrode which faces said drain electrode is by a lateral distance approximately equal to the thickness of said gate dielectric layer.

4. The high voltage thin film transistor as defined in claim 1 wherein said charge transport layer comprises an amorphous silicon material.

* * * * *